United States Patent
Morley et al.

(10) Patent No.: US 6,907,055 B2
(45) Date of Patent: Jun. 14, 2005

(54) METHOD AND CIRCUIT FOR MEASURING THE OPTICAL MODULATION AMPLITUDE (OMA) IN THE OPERATING REGION OF A LASER DIODE

(75) Inventors: Sean Morley, Co. Limerick (IE); Brian Russell, Co. Limerick (IE)

(73) Assignee: Analog Devices, Inc., Norwood, MA (US)

( * ) Notice: Subject to any disclaimer, the term of this patent is extended or adjusted under 35 U.S.C. 154(b) by 59 days.

(21) Appl. No.: 10/012,910

(22) Filed: Nov. 13, 2001

(65) Prior Publication Data

US 2003/0090289 A1 May 15, 2003

(51) Int. Cl.[7] .................................................. H01S 3/00
(52) U.S. Cl. ................ 372/38.1; 372/38.01; 372/38.02; 372/38.03; 372/38.04; 372/38.05; 372/38.06; 372/38.07; 372/38.08; 372/38.09; 372/23; 372/31
(58) Field of Search ................ 372/26, 31, 38.01–38.09

(56) References Cited

U.S. PATENT DOCUMENTS

| | | | |
|---|---|---|---|
| 5,208,513 A | * 5/1993 | Murayama ................... 315/129 |
| 5,212,700 A | * 5/1993 | Okita ........................ 372/38.07 |
| 5,247,532 A | * 9/1993 | Levinson ..................... 372/38.1 |
| 5,257,202 A | * 10/1993 | Feddersen et al. ............. 702/32 |
| 5,479,424 A | * 12/1995 | Sakuyama ..................... 372/26 |
| 5,850,409 A | * 12/1998 | Link ........................ 372/38.01 |
| 6,574,124 B2 | * 6/2003 | Lin et al. ....................... 363/65 |
| 2002/0191261 A1 | * 12/2002 | Notargiacomo et al. .... 359/181 |
| 2003/0035451 A1 | * 2/2003 | Ishida et al. .............. 372/38.02 |

* cited by examiner

*Primary Examiner*—Minsun Oh Harvey
*Assistant Examiner*—Delma R. Flores-Ruiz
(74) *Attorney, Agent, or Firm*—Wolf, Greenfield & Sacks, P.C.

(57) ABSTRACT

A method and circuit for measuring the optical modulation amplitude in the operating region of a laser diode is described. The method utilises two measurements of OMA, each measurement being related to the slope in a specific portion of the operating region of the power/current characteristic curve of the laser diode. By combining the two measurement values, the invention provides a 1 measurement for OMA in the operating region of the laser diode that allows for the presence of a non-linear response in the region.

58 Claims, 9 Drawing Sheets

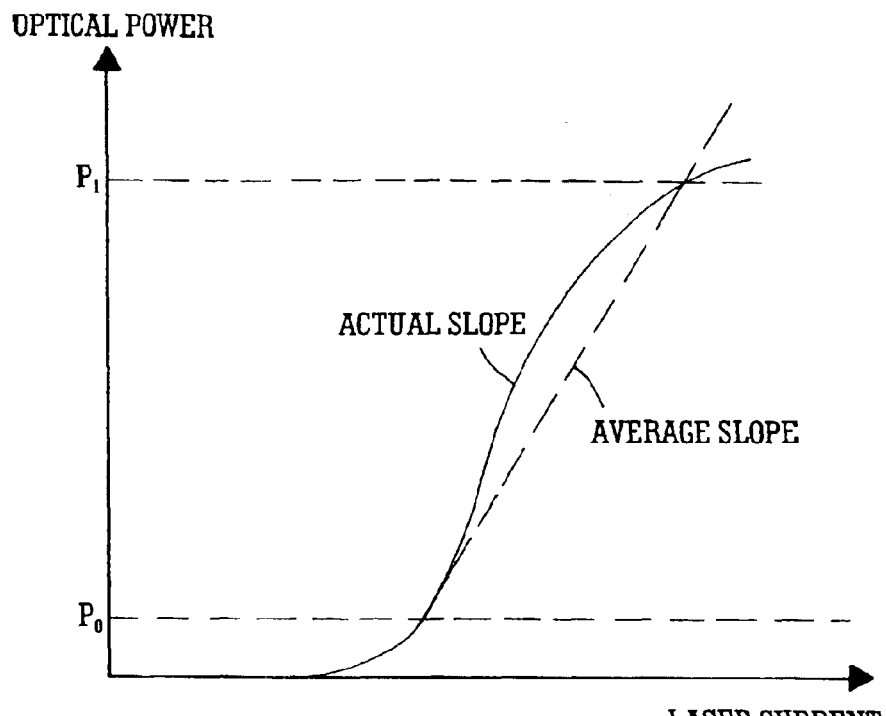
FIG. 6
Prior Art
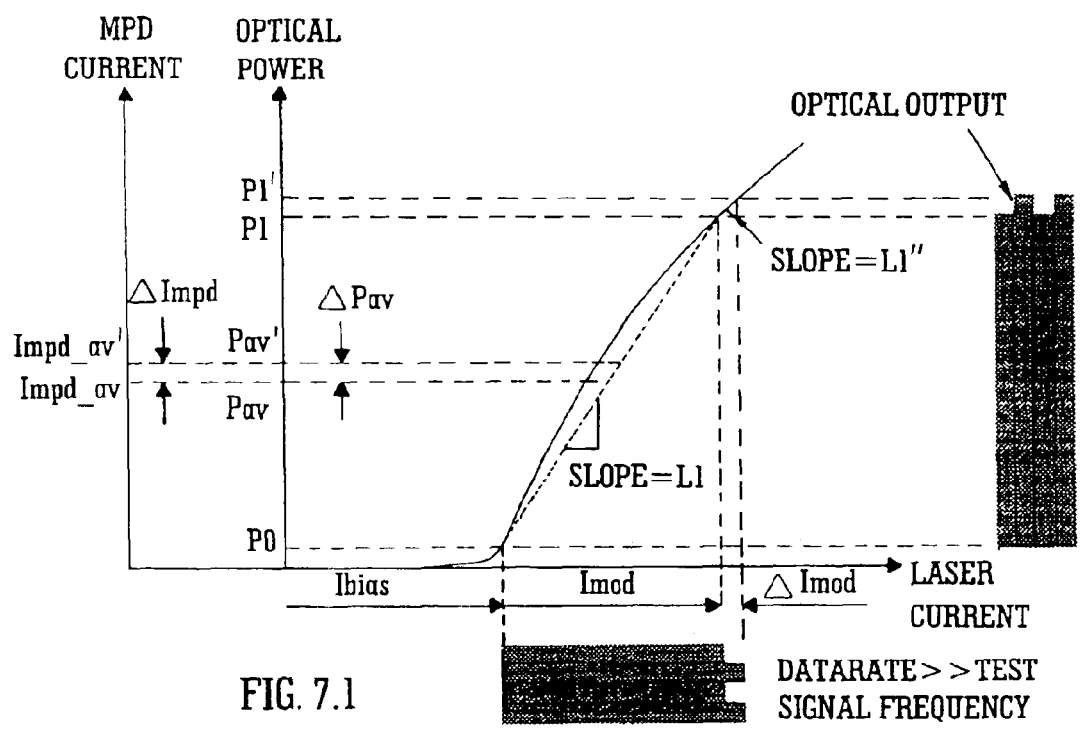
FIG. 7.1

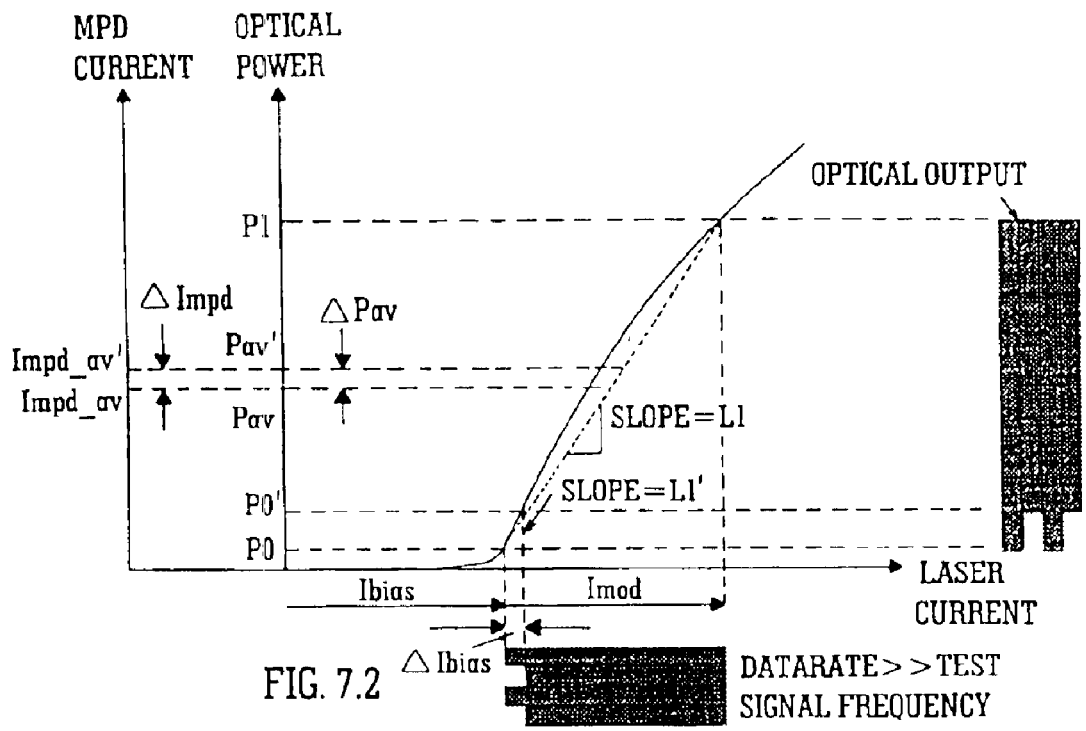
FIG. 7.2
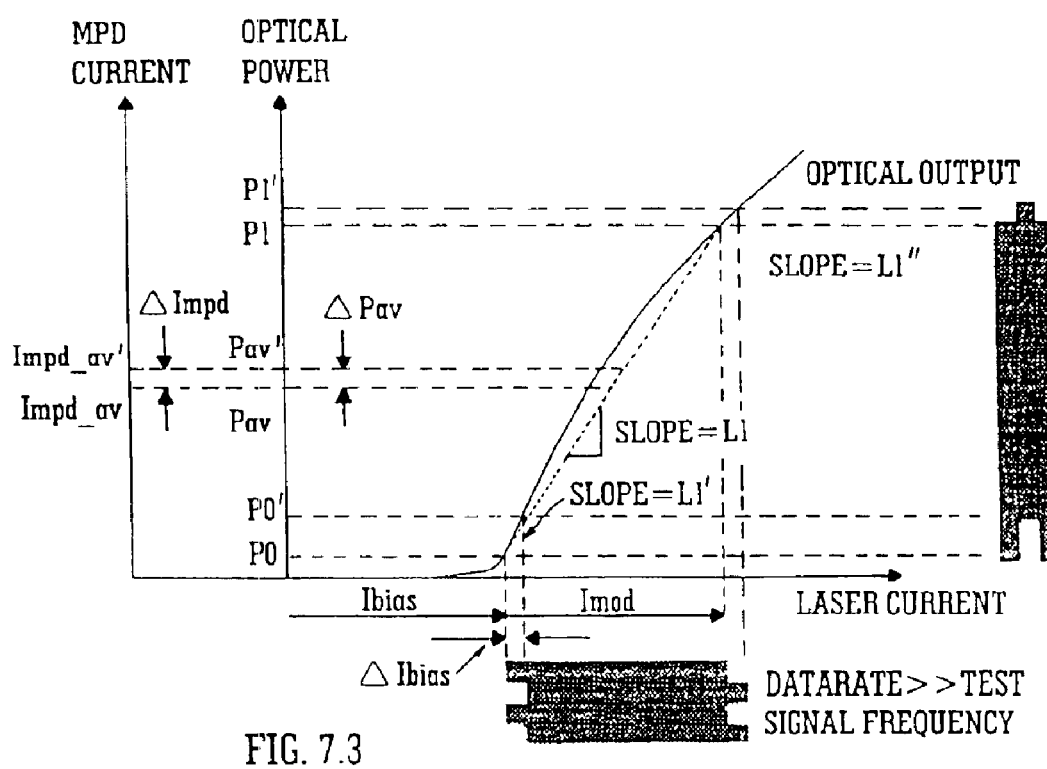
FIG. 7.3

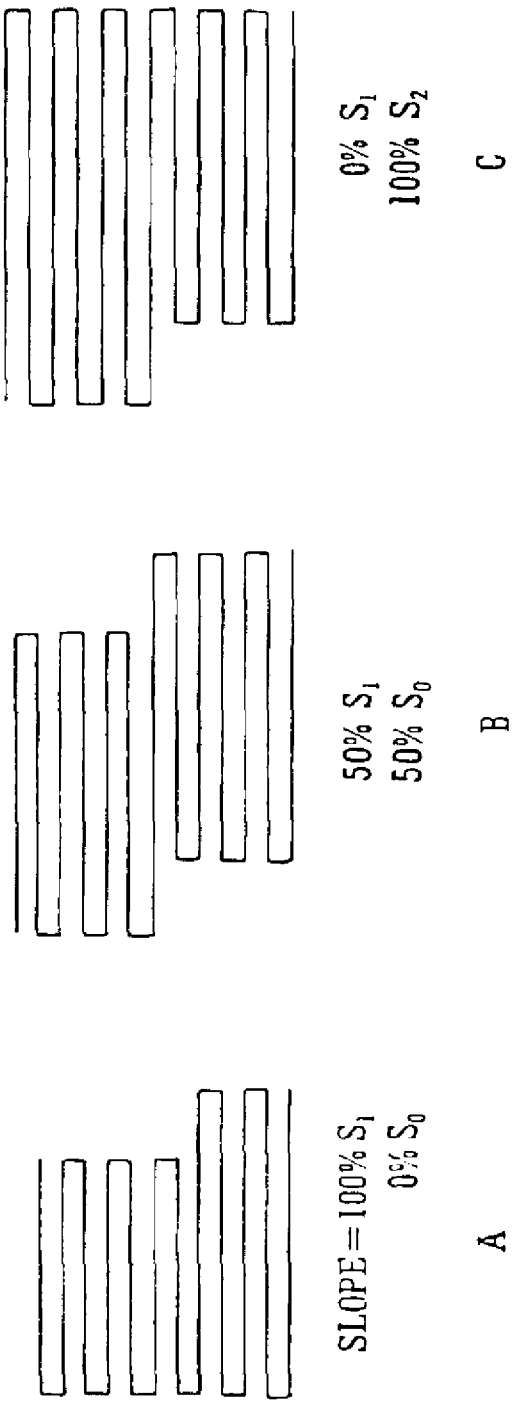

METHOD AND CIRCUIT FOR MEASURING THE OPTICAL MODULATION AMPLITUDE (OMA) IN THE OPERATING REGION OF A LASER DIODE

FIELD OF THE INVENTION

The invention relates to a method and to a control circuit for measuring the optical modulation amplitude (OMA) in the operating region of a laser diode. It also relates to a method and circuit for using the measured OMA as a control parameter in operation of the laser.

BACKGROUND TO THE INVENTION

Laser diodes are extensively used in optical transmission systems as light emitters for transmitting data in digital form over telecommunications networks. Optical transmission is based around generating a constant optical signal regardless of changes in the laser diode's operating environmental conditions or ageing considerations resultant from the progress of time.

The transmission is achieved by analysis of the laser's optical power output/current input characteristic curve, which has an initial inactive linear portion which is almost horizontal with a very slight upward slope. The curve then has a knee portion which is generally called the threshold point at which stimulated light emission commences. The characteristic curve then continues as a relatively linear portion with a relatively steep slope. This, is referred to as the linear operating portion or operating region of the slope, and is the usual operating region for optical transmission systems.

A typical optical transmitter 100 includes a laser diode 200, a monitor photo diode 300 and a laser diode driver 400 and is shown in FIG. 1. The laser diode 200/laser diode driver 400 combination is factory calibrated to a particular average power Pav, and optical modulation amplitude (OMA). Two currents are controlled by the laser diode driver 400. A DC bias current is applied to the laser diode of value sufficient to maintain a predetermined average optical power output. A switched modulation current is applied to the laser diode 200 to establish a predetermined modulation amplitude OMA.

When transmitting data the modulation current is switched by the data stream. This data generally has an equal probability of ones and zeros. The only measurement taken from the laser diode is the monitor photo diode (MPD) current. The MPD gives a current proportional to the laser output power. Generally, the MPD bandwidth is much lower than the data rate so that the MPD current is a measure of the average laser output power. Typically the data rate is about 2.5 Gbps, and the MPD bandwidth is about 1 MHz. A tuning of each laser diode is required as the threshold current (the current at which the characteristic curve passes the threshold point), the post threshold current to light slope efficiency LI, optical coupling from the laser diode to the monitor photo diode and monitor photo diode responsivity changes between devices.

FIG. 2 shows the transfer function of an ideal laser diode. The power/current characteristic curve tends to vary with temperature and also varies as the laser diode ages. Three typical power/current characteristic curves of a laser diode, namely, curves A, B and C are illustrated in FIG. 2. The curves A, B and C illustrate how the power/current characteristic curves vary with temperature. The curve A illustrates the power/current characteristic curve of the laser diode when operating at 0° C. The curve B illustrates the characteristic curve of the laser diode operating at 25° C., while the curve C illustrates the characteristic curve of the laser diode operating at 70° C. An operating range of 0° C. to 70° C. is not an unusual operating temperature range for a laser diode. In each curve A, B and C the inactive portion is illustrated by the letter e. The threshold point of the curve is illustrated by the letter f, while the operating portion of each curve is illustrated by the letter g. The effect of ageing is somewhat similar to that of increasing temperature.

The input current in milliamps (mA) to the laser diode is plotted on the X axis of the graph of FIG. 2 while the optical power output in milliwatts (mW) of the laser diode is plotted on the Y axis. The bias current to the laser diode is indicated as $I_b$, while the modulation current is indicated as $I_m$. The power output of the laser diode when the bias current $I_b$ and the modulation current $I_m$ are applied to the laser diode is indicated as $P_1$ while the power output of the laser diode when the only current applied to the laser diode is the bias current $I_b$ is indicated as $P_0$. The average power output of the laser diode is indicated as $P_{av}$, which, assuming an equal number of digital ones and zeros in the data stream, is equal to half the sum of $P_1$ and $P_0$. It will be appreciated that if the laser operates too close to the threshold point, that the wavelength of the light changes and the switching speed may slow down. In order for the laser diode to operate efficiently, the bias current should be sufficient to operate the laser diode in the linear operating portion of the power/current characteristic curve just above the threshold point, in other words, the point h of the curve B, for example. To achieve this the bias current operates the laser diode to produce a power output of $P_0$. In this way, when the modulation current $I_m$ is applied to the laser diode on top of the bias current $I_b$, the laser diode operates in the linear operating portion of the curve, namely, between the point h and the point k on the curve B. By operating the laser diode so that the power output varies between the points h and k on the characteristic curve B in response to the modulation current the laser diode operates with an optimum OMA, which will be understood as the difference between the power output $P_1$ and the power output $P_0$. It is sometimes also common to define the ratio of the power output $P_1$ to the power output $P_0$ as the extinction ratio of the laser diode, which is a term often used in combination with the average power to define the performance of the laser. It will be appreciated that with a control of the OMA and the average power, that an equivalent control of the extinction ratio is effected. Another term commonly used with reference to laser diode operation is the slope or slope efficiency (light/current) LI. This term is used to represent the average slope in the operating region.

However, it will be clear from the curves A, B and C of FIG. 2 that should the operating temperature of the laser diode vary, unless the bias current $I_b$ and the modulation current $I_m$ are varied to compensate for the change in operating temperature, the laser diode will operate incorrectly. For example, if the bias current $I_b$ and the modulation current $I_m$ were set to operate the laser diode at an operating temperature of 25° C., an increase in the operating temperature would immediately cause the OMA of the laser diode to drop, and also would result in a reduction in the average power output $P_{av}$ of the laser diode.

Accordingly, in order for a laser diode to provide an adequate average power Pav and OMA over its life and over a typical range of operating temperatures, control circuitry is required for altering the bias current $I_b$ and the modulation $I_m$ to compensate for changes in operating temperature and as the laser diode ages.

In short reach applications (applications over a short fibre length) direct modulation of the laser diode is used to meet price and size requirements. These interfaces have traditionally used a combination of open and closed loop control systems.

An open loop approach is based upon measuring environmental conditions and adjusting control parameters and is based on the assumption that every laser reacts in the same manner. A typical open loop control circuit is shown in FIG. 3, which shows a closed loop control of average power and open loop control of OMA. The circuit can be considered as comprising an open loop portion and a closed loop portion. The closed loop portion comprises a variable resistor $R_{pset}$ 500 at a potential between the current output of the MPD 300, and a voltage Vee. The current output from the MPD is converted to a voltage $V_{pset}$ and the control loop incorporating summing element 600 and a reference voltage source 700 are adapted to keep the average power constant by keeping Vpset and hence the MPD current constant. A constant MPD current then equates to a constant average power at the laser, thus effecting a control of the average power. It will be appreciated that errors in the average optical power will be present due to MPD tracking errors and control loop effects such as the temperature coefficient of $R_{pset}$ and the input offset voltage of the control loop input stage.

The open loop control of the OMA effects control of the OMA by incorporating a temperature dependant element 800 to monitor the operating temperature of the laser diode. The modulation current is then altered in response to temperature change of the laser diode. The temperature modified modulation current is then modulated by a data stream fed into the current through a data switch 900, and used to drive the laser diode 200.

A disadvantage of such circuits is that they tend to be inaccurate. They do not measure the OMA directly. Measuring temperature gives only an indirect measure of the slope efficiency LI, and is not particularly accurate as the LI as discussed may, in general, drift with age. Thus, any corrections made to correct the OMA based on the operating temperature of the laser diode may be incorrect, thus leading to incorrect operation of the laser diode. The method also assumes that all lasers behave identically with regard to temperature which is not the actual situation. The simplification is sustainable in small or low volumes as the maintenance considerations can be dealt with, and the impaired performance is acceptable as part of a price/performance compromise. As the volumes increase, the compromises cost more in terms of human resources required to maintain a design and support structure.

These early systems have been modified to new monolithic control systems that actively measure the characteristics of the laser and adjust the drive currents accordingly. Circuits performing these functions have been available for some time and an example is shown in FIG. 4. This circuit utilises a concept known as dual loop control, a term used to define a circuit that controls both the bias current and the modulation current based on measurements taken directly from the laser diode. There are various implementations used by dual loop controllers. Some use peak detection to determine the OMA. Peak detection is limited in that the response of the monitor photo diode is usually not sufficiently quick to allow detection of $P_1$ and $P_0$ in the data stream. This can be overcome by relying on several consecutive ones and zeroes in various header formats. This, however, can make the device application and data rate specific as well as placing speed requirements on the monitor photo diode.

Alternative dual loop implementations, such as that disclosed in U.S. Pat. No. 5,850,409 assigned to Maxim, are independent of data rate or monitor photo diode bandwidth and operate on the principle of the addition of a low frequency small signal into the optical waveform on top of the modulation current. A simplified example of the operation of such a dual loop scheme using tone control is shown in FIG. 5. A low frequency tone 10 is added to the modulation current and can be considered as sitting on top of the optical one level. It will be understood that the frequency of this tonal element is typically much less than the frequency of the modulation current and is low enough to be detected directly by the MPD. In this example, the control loop has a measure of the average power via the monitor photo diode current and the laser modulation amplitude via the tone amplitude imposed in the monitor photo diode current. By referring to FIG. 5, it can be seen that from the similar triangles rule that (impd1'−impd1)/Δimod=(impd1−impd0)/imod. If Δimod=imod/K, i.e. proportional to imod, then it can be seen that (impd1−impd0)=k*(impd1'−impd1). Since impd1 and impd0 are a measure of $P_1$ and $P_0$, it will be understood that (impd1'−impd1) is proportional to the OMA. Due to the low bandwidth of the MPD, impd1 and impd1' are not directly observed at the MPD output. What is observed is the change in the average MPD current impd_av'−impd_av which is equal to (impd1'−impd1)/2. Therefore, the amplitude of the tone in the average MPD current is proportional to the OMA and can be used as a control parameter to control the OMA. Therefore it will be appreciated that the control circuitry can maintain a constant average power and OMA by controlling the bias current and the modulation current, and has many advantages over open loop systems including the following:

laser diode slope efficiency variation over temperature is tracked directly not inferred in some open loop manner, laser diode slope efficiency variation due to ageing is directly tracked over time statistical sampling of laser diode slope efficiency temperature coefficient is eliminated from the design process on-going statistical sampling of laser diode slope efficiency temperature coefficient is eliminated in manufacturing second sourcing options are greatly enhanced as one is not limited to specific components for inclusion in the circuitry.

All these features have allowed for more robust optical systems to be manufactured but are still limited in that they rely on the assumption that the operating region of the laser diode is linear. FIG. 6 shows a comparison of theoretical and actual slope efficiency and it can be seen that the actual operating region of the laser diode is in effect not linear. It will be understood that the measurement of OMA by application of a test signal at one point can lead to errors as the estimate can be too large or too little depending on the position at which the test signal was applied.

There, therefore, exists a need for a method and circuit that is based on an analysis of the laser diode power output and the fact that non-linearities are present, and takes the existence of the non-linearities into consideration when providing a measurement value for OMA.

SUMMARY OF THE INVENTION

These and other needs are addressed by the present invention which provides a circuit and method for providing a measurement of OMA which takes the presence of non-linearities in the power output curve of the laser into account when providing said measurement. The present invention provides the measurement by enabling a dual measurement, the combination of this dual measurement providing a better measure of the actual value of the OMA. The present invention may additionally provide for a weighting value to be applied to this dual measurement so that the weighting applied to the measurement taken at a first region in the curve can be altered with respect to the weighting applied to the measurement at the second region of the curve.

According to the invention there is provided a method for measuring the optical modulation amplitude (OMA) of a laser diode in the operating region of the laser diode, the method comprising the steps of:

applying a test signal to a bias current signal applied to the laser diode, the application of the test signal enabling two measurements of OMA to be effected, each OMA measurement being related to the slope of the laser diode operating region as measured at the specific measurement position, combining the two OMA measurement values so as to provide a measure of the overall laser diode OMA within the operating region.

Desirably, the two OMA measurements are related to the slope of the laser diode operating region as measured about $P_0$ and $P_1$. It will be understood that the slopes as measured about $P_1$ and $P_0$ effect two measurement of OMA, each measurement representing the OMA at each of the two positions respectively.

Desirably, the two measurements of OMA are effected by detecting the change in average power resultant from the application of the test signal.

The incorporation of a test signal into the bias current effects the formation of a twopart bias current: a base portion comprising the bias current without the test signal and the top portion comprising the test signal element.

The test signal may be a signal applied to the bias current at predetermined time sequences during the operation of the laser diode or may be a continual signal applied throughout operation of the laser diode.

The method may additionally provide for applying a modulation test signal to a modulation current applied to the laser diode.

The application of two test signals, one to the bias current and one to the modulation current, may additionally provide for a weighting value to be applied to the combination of the two measurement values.

In one embodiment the modulation test signal is incorporated with or applied to the modulation current at the same time as the test signal is applied to the bias current.

In such an embodiment the weighting value applied to the combination of the two measurement values may be varied by changing the size of test signal applied to the bias current as compared to the size of the modulation test signal applied to the modulation current.

The invention additionally provides for the concurrent measurement of a weighted combination of two OMA measurement values, the concurrent measurement being provided by the output of a monitor photo diode coupled to the laser diode.

In an alternative embodiment the present invention provides for a first modulation test signal to be incorporated with or applied to the modulation current at the same time as a first test signal is applied to the bias current thereby forming a first OMA measurement value and some time later providing for a second modulation test signal to be incorporated with or applied to the modulation current at the same time as a second test signal is applied to the bias current thereby forming a second OMA measurement value, the combination of the first and second OMA measurement values effecting an overall OMA measurement for the laser diode operating region.

The invention may additionally provide for the combination of the first and second OMA measurement to be conducted in a weighted manner.

The first set of test signals may provide for a measurement of OMA related to the slope as measured about $P_1$ as opposed to the slope as measured about $P_0$.

The measurement of the slope about $P_1$ as opposed to the slope as measured about $P_0$ is effected by a minimal test signal being incorporated with the bias current and a modulation test signal being incorporated with the modulation current.

The second set of test signals may provide for a measurement of OMA related to the slope as measured about $P_0$ as opposed to the slope as measured about $P_1$.

The measurement of the slope as measured about $P_0$ as opposed to the slope as measured about $P_1$ is desirably effected by a test signal being incorporated with the bias current and a complementary modulation test signal being incorporated with the modulation current.

The weighting of the combination of the first and second OMA measurements so as to provide an overall OMA measurement is desirably effected by combining the first and second OMA measurements in a suitable manner.

The OMA measurement is typically detected using a monitor photo diode, a change in average power as detected by the MPD giving a value indicative of the OMA.

In such sequential applications the method of the present invention may provide for a storage of the output of the monitor photo diode for each cycle and a processing of successive stored outputs so as to effect a weighted average.

The amplitudes or size of the test signals are desirably related to the amplitude or size of the modulation current.

Preferably, the amplitude of the test signal is of magnitude sufficiently small as not to affect normal operation of the laser diode.

In one embodiment of the invention the size of the test signal by which the bias current or modulation current is altered does not exceed 5% of the value of the modulation current, and preferably, the test signal amplitude does not exceed 1% of the value of the modulation current.

The test signals incorporated with either the bias or modulation current may be selected from a number of different types of signal types including but not limited to a pseudo digital waveform, square waves, or sinusoidal type waveforms. By the term a pseudo digital waveform it is intended to cover any type of waveform that switches between discrete values at particular times.

The invention may additionally provide a method of controlling the OMA of a laser diode, the method comprising the steps of:

measuring the OMA of the laser diode in a manner as hereinbefore described, comparing the measured value of the OMA with a predetermined corresponding reference OMA value, and altering the modulation current to the laser diode in response to the measured OMA value not comparing favourably with the reference OMA value.

The modulation current may be altered by an amount, the amount being selected from:

a) a predetermined value, or b) an amount proportional to the difference in value between the measured OMA value and the reference OMA value.

The invention may additionally provide a method for controlling the extinction ratio of a laser diode, the method comprising the steps of:

controlling the average power of the laser diode, and controlling the OMA in accordance with the steps outlined above.

The method of controlling the average power typically comprises the steps of:

measuring the average power at a first instance, and measuring any variants to that average power measurement and modifying the bias current to compensate for any variance.

The bias current may be altered by an amount, the amount being selected from:

a) a predetermined value, or b) an amount proportional to the difference in value between the measured average power and the reference average power.

In one embodiment of the invention the method further comprises the step of controlling the average power output of the laser diode by comparing the average power output with a predetermined reference average power output value, and varying the bias current to the laser diode in response to the average power output not comparing favourably with the reference average power output value.

Optionally, the bias current to the laser diode is altered by a predetermined correcting amount in response to the average power output not comparing favourably with the reference average power output value. Alternatively, the correction value is a value made in proportion to the error between the two values.

In one embodiment of the invention, the OMA value in the operating region of the power/current characteristic curve of the laser diode is compared with the reference OMA value at periodic intervals. Typically the periodic intervals are about 5 ms.

The reference OMA value is typically set and stored during calibration of the laser diode. It will be appreciated that a number of different methodologies could be implemented to store a suitable reference value; for example the reference value may be set by adjusting an external resistor in combination with a reference voltage so as to give a reference current, another example would be the utilisation of a digital control to generate the reference and then a storage of the digital control in a device such as an EEPROM.

In a further embodiment of the invention the stored reference OMA value is a reference value of the change in the average power output of the laser diode which should result from the alteration to the bias current by the test signal if the laser diode were operating at the desired OMA.

Optionally, the comparison of the OMA value with the reference OMA value and the comparison of the average power output with the reference average power output value are alternately made.

Advantageously, the base portion of the bias current, i.e. that portion of the bias current not including the test current, to the laser diode is maintained constant during the period while the OMA value of the power/current characteristic curve is being determined.

Advantageously, the base portion of the modulation current, i.e. that portion of the modulation current not including the test signal, applied to the laser diode is maintained constant during the period while the average power value of the power/current characteristic curve is being determined.

The comparison may also be made concurrently so as to allowing for the bias current and the modulation currents to be corrected at the same time.

It will be appreciated that the method of the present invention may be used in combination with a known laser diode/monitor photo diode (MPD) combination, the monitor photo diode providing a current output which is representative of the average power of the laser diode.

Additionally, the present invention may provide a control circuit adapted to measure the optical modulation amplitude (OMA) in the operating region of a laser diode, the circuit comprising:

means for incorporating a test signal with a bias current signal applied to the laser diode, means for enabling two measurements of OMA to be effected, each OMA measurement being related to the slope of the laser diode operating region as measured at a specific measurement position, and means for combining the two OMA measurement values so as to provide a measure of the overall laser diode OMA within the operating region.

The means for enabling the two measurements of OMA to be effected and for combining the two measurements so as to provide a measure of the laser diode OMA in the operating region may be a monitor photo diode (MPD), the MPD providing a current input to the circuit of the present invention that is representative of the laser diode OMA in the operating region.

Additionally, the invention may provide a control circuit for controlling the OMA of a laser diode, the control circuit comprising:

means for determining a value for the OMA in the operating region of the power/current characteristic curve of the laser diode, the value determined being related to the value of the OMA as measured at two positions in the operating region, comparing means for comparing the measured OMA value with a corresponding reference OMA value, a first control means for controlling the modulation current to the laser diode, the first control means being responsive to the comparing means for altering the modulation current in response to the measured OMA value not comparing favourably with the reference OMA value.

The modulation current is typically altered by an amount being selected from:

a predetermined value, or a value proportional to the difference between the measured OMA value and the reference OMA value.

Advantageously, the amount by which the modulation current is altered by the control means is such as not to affect the normal operation of the laser diode.

Desirably, the means for determining the OMA value in the operating region of the power/current characteristic curve of the laser diode comprises:

a second control means for altering the bias current to the laser diode by a test amount, and a means for determining the corresponding change in the average power output of the laser diode resulting from the alteration of the bias current by the test amount.

In another embodiment of the invention the comparing means compares the change in the average power output of the laser diode with a reference value.

Preferably, the second control means maintains the alteration to the bias current by the test amount for a period sufficient to allow the resulting corresponding change in the average power output of the laser diode to be determined.

The test amount by which the bias current may be altered is typically selected from:

a) a predetermined value, or
b) an amount proportional to the difference in value between the measured OMA value and the reference OMA value.

Advantageously, the test amount by which the bias current is altered by the second control means is such as not to affect the normal operation of the laser diode.

Preferably, the test amount by which the bias current is altered by the second control means is proportional to the modulation current when the bias current is being altered.

Advantageously, the second control means increases the bias current by the test amount. Preferably, the test amount by which the bias current is altered by the second control means does not exceed 5% of the bias current when the bias current is being altered. Ideally, the test amount by which the bias current is altered by the second control means does not exceed 1% of the bias current when the modulation current is being altered.

In one embodiment of the invention the first control means alters the modulation current by a predetermined correcting amount in response to the measured OMA value not comparing favourably with the reference OMA value. Preferably, the correcting amount by which the first control means alters the modulation current in response to the measured OMA value not comparing favourably with the reference OMA value does not exceed 1% of the maximum value of the modulation current which may be applied by the first control means.

In one embodiment of the invention the control circuit further comprises a power output comparing means for comparing the average power output of the laser diode with a predetermined reference average power output value, and a bias current control means for controlling the bias current to the laser diode, the bias current control means being responsive to the power output comparing means for altering the bias current to the laser diode in response to the average power output of the laser diode not comparing favourably with the reference average power output value.

In a first embodiment, the comparing means and the power output comparing means are alternately operated for alternately comparing the OMA value with the reference OMA value and the average power output with the reference average power output value, respectively.

Advantageously, the bias current control means holds the base portion of the bias current constant during the time when the OMA value is being measured and the comparison made.

Desirably, the control means holds the base portion of the modulation current constant while the average power is being measured.

Preferably, a means is provided for setting the reference OMA value.

Alternatively, the OMA comparing means and the power output comparing means are concurrently operated for concurrently comparing the measured OMA value with the reference OMA value and the average power output with the reference average power output value, respectively.

The invention additionally provides a laser diode driver circuit for driving a laser diode having a monitor photo diode optically coupled thereto, the monitor photo diode (MPD) having an output current indicative of the OMA value of the laser diode, the circuit comprising:
  a modulation current source for providing a current for modulation in response to a data stream to be transmitted by the laser diode,
  a control circuit for controlling the OMA of the laser diode, the control circuit comprising:
  comparing means adapted to compare an output MPD current with a reference current,
  a first control means for controlling the modulation current source, the first control means being responsive to the OMA comparing means for altering the modulation current from the modulation current source in response to the measured OMA value not comparing favourably with the reference OMA value, and wherein the output current of the MPD is a value indicative of a combination of the OMA value at two positions of the operating portion of the power/current characteristic curve.

The circuit may additionally comprise:
  a bias current source for providing a bias current to the laser diode,
  a second control means for altering the bias current by a test amount and determining the corresponding change in the average power output resultant from said alteration, and wherein the average power is detected from the output of the MPD.

Further the invention provides a laser diode driver circuit comprising:
  a modulation current source for providing a current for modulation in response to a data stream to be transmitted by the laser diode,
  a bias current source for providing a bias current to the laser diode,
  a control circuit for controlling the OMA of the laser diode, the control circuit comprising:
  a means for determining a value for the OMA in the operating region of the power/current characteristic curve of the laser diode, the measured OMA value being related to the slope at two positions in the operating portion of the power/current characteristic curve,
  an OMA comparing means for comparing the measured OMA value related to the slope of the power/current characteristic curve with a corresponding reference OMA value,
  a first control means for controlling the modulation current source, the first control means being responsive to the OMA comparing means for altering the modulation current from the modulation current source in response to the measured OMA value not comparing favourably with the reference OMA value, and
  a second control means for altering the bias current by a test amount and determining the corresponding change in the average power output resultant from said alteration.

ADVANTAGES OF THE INVENTION

The advantages of the invention are many some of which are common to traditional dual loop control techniques such as those identified in the section background to the invention. Additionally, the method and control circuit allow for a more accurate measurement of the OMA in the operating portion of the laser and hence a more accurate control of the OMA of a laser diode. By monitoring and determining the OMA related to the slope as measured at two positions in the operating portion of the power/current characteristic curve, the operating characteristics of the laser diode are more accurately estimated, and thus, the OMA can be accurately controlled. The measurement at two positions effects a more accurate measurement of the OMA than methods which utilise a single measurement and make assumptions with regard to the linear operation of the laser diode. The OMA may be corrected by making relatively small incremental or decremental changes to the modulation current as appropriate, and each incremental or decremental change may be of a predetermined correcting amount, or of an amount proportional to the error.

Additionally, the method and control circuit provide a relatively simple and accurate method and circuit for controlling the OMA, and as well the average optical power output which has no affect on the data transmission. Additionally, the method and control circuit permit accurate correction of the OMA without affecting data transmission, and thus, the OMA can be corrected during normal operation of the laser diode.

Further objects, features and advantages of the present invention will be more clearly understood from the following description of a preferred embodiment thereof which is given by way of example only with reference to the accompanying drawings.

BRIEF DESCRIPTION OF THE DRAWINGS

FIG. 6 shows the deviation between the theoretical response and actual response of a power/current characteristic curve, FIG. 7.1 shows a measurement of the OMA at $P_1$ according to the present invention, FIG. 7.2 shows the measurement of the OMA at $P_0$ according to the present invention, FIG. 7.3 shows the measurement of the OMA at $P_1$ and $P_0$ according to the present invention, FIG. 8 is a schematic showing the effect of varying the weighting in the combination of the component slopes so as to effect a value for $P_{av}$ in accordance with the present invention.

DETAILED DESCRIPTION OF A PREFERRED EMBODIMENT

Figure 1:
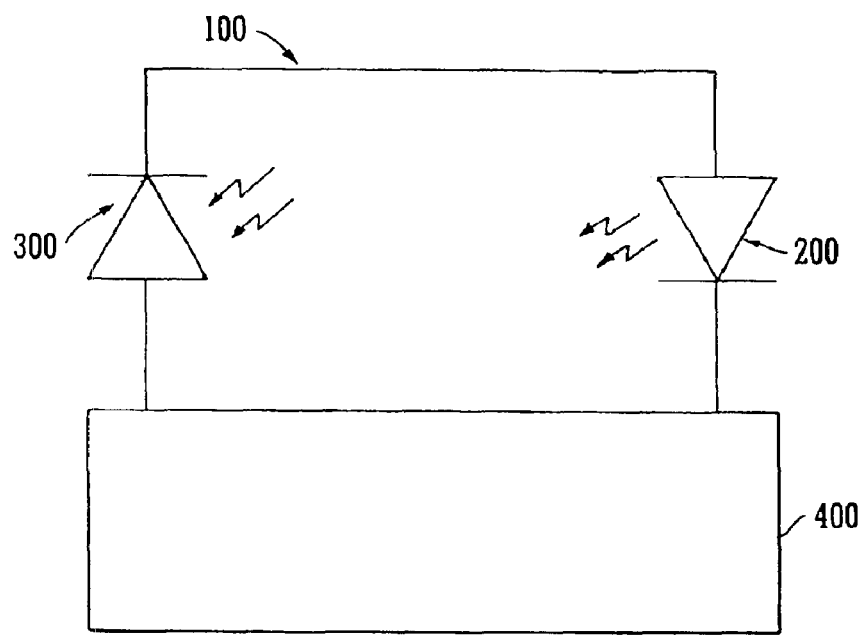
FIG. 1 is a block diagram of a typical optical transmission device incorporating a laser diode
Figure 2:
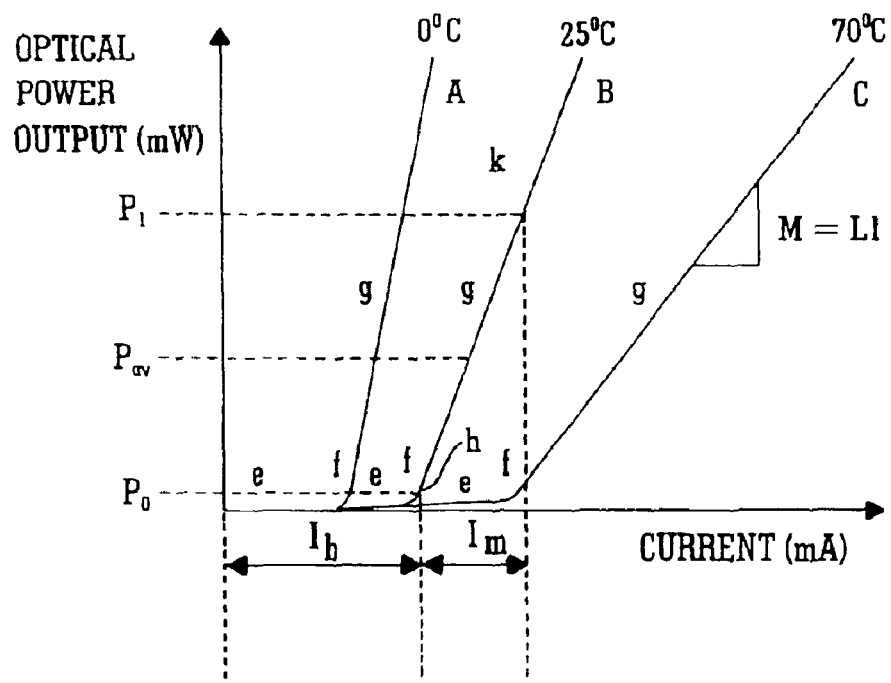
FIG. 2 illustrates typical power/current characteristic curves of a typical laser diode.
Figure 3:
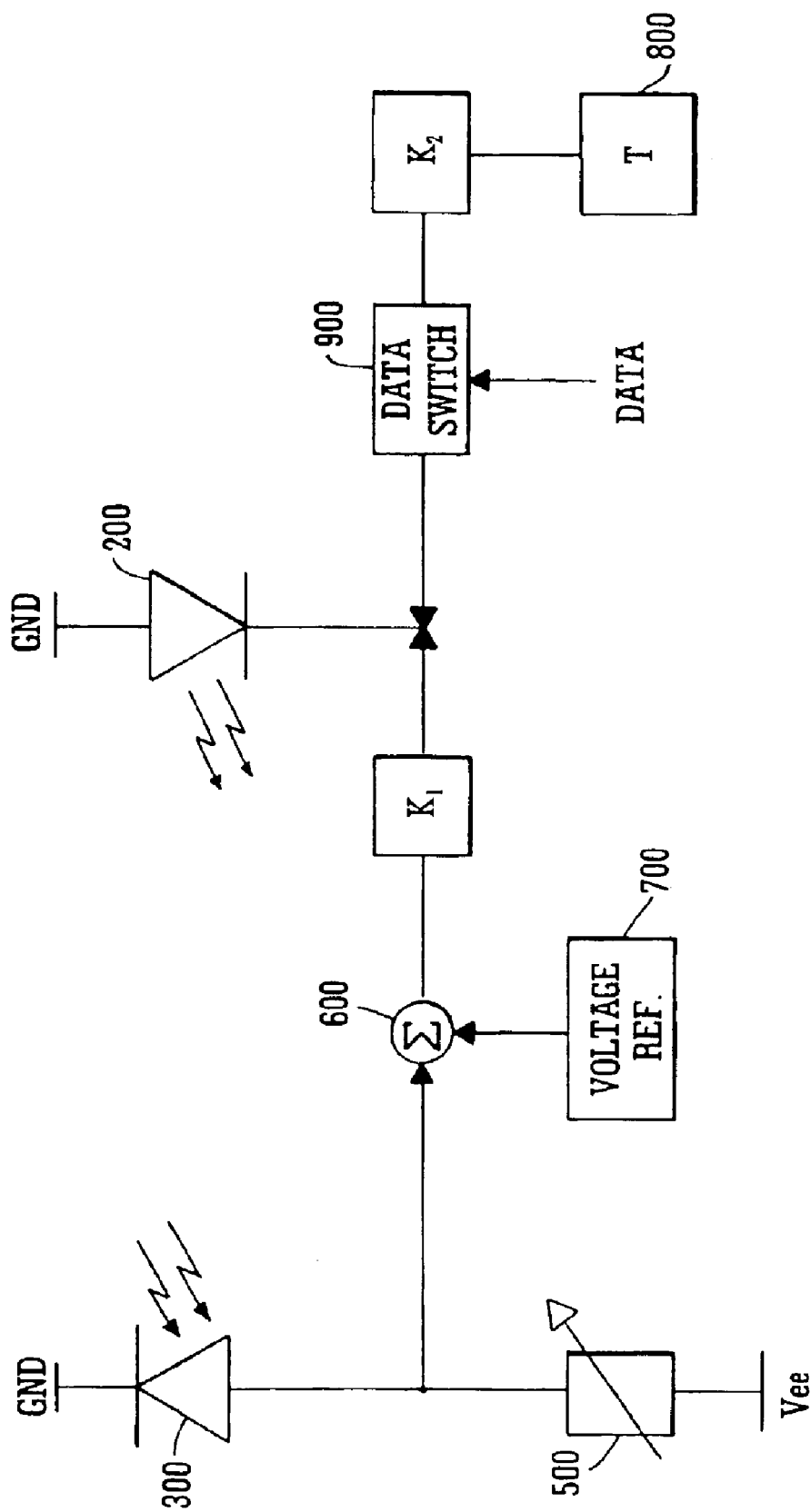
FIG. 3 shows an open loop configuration for controlling the OMA of a laser diode
Figure 4:
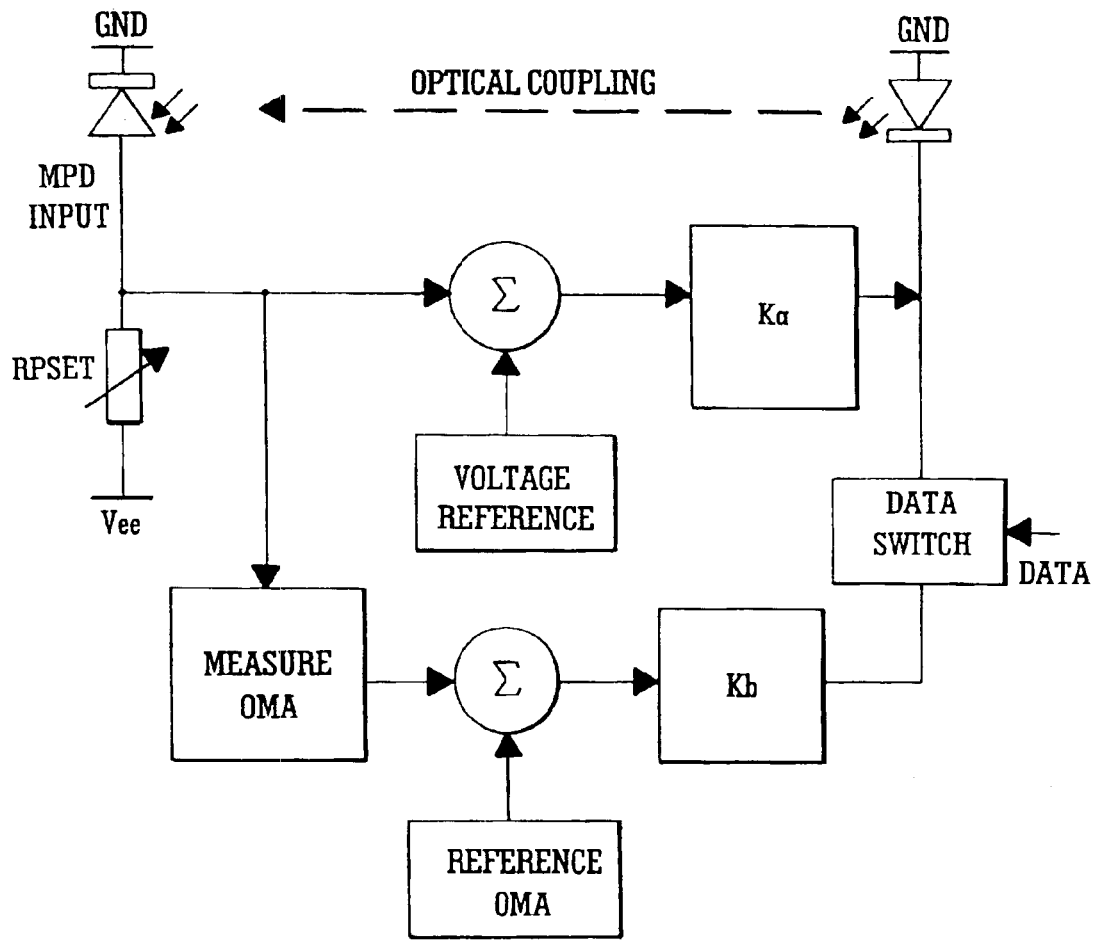
FIG. 4 shows a known dual loop laser diode driver with a laser module.
Figure 5:
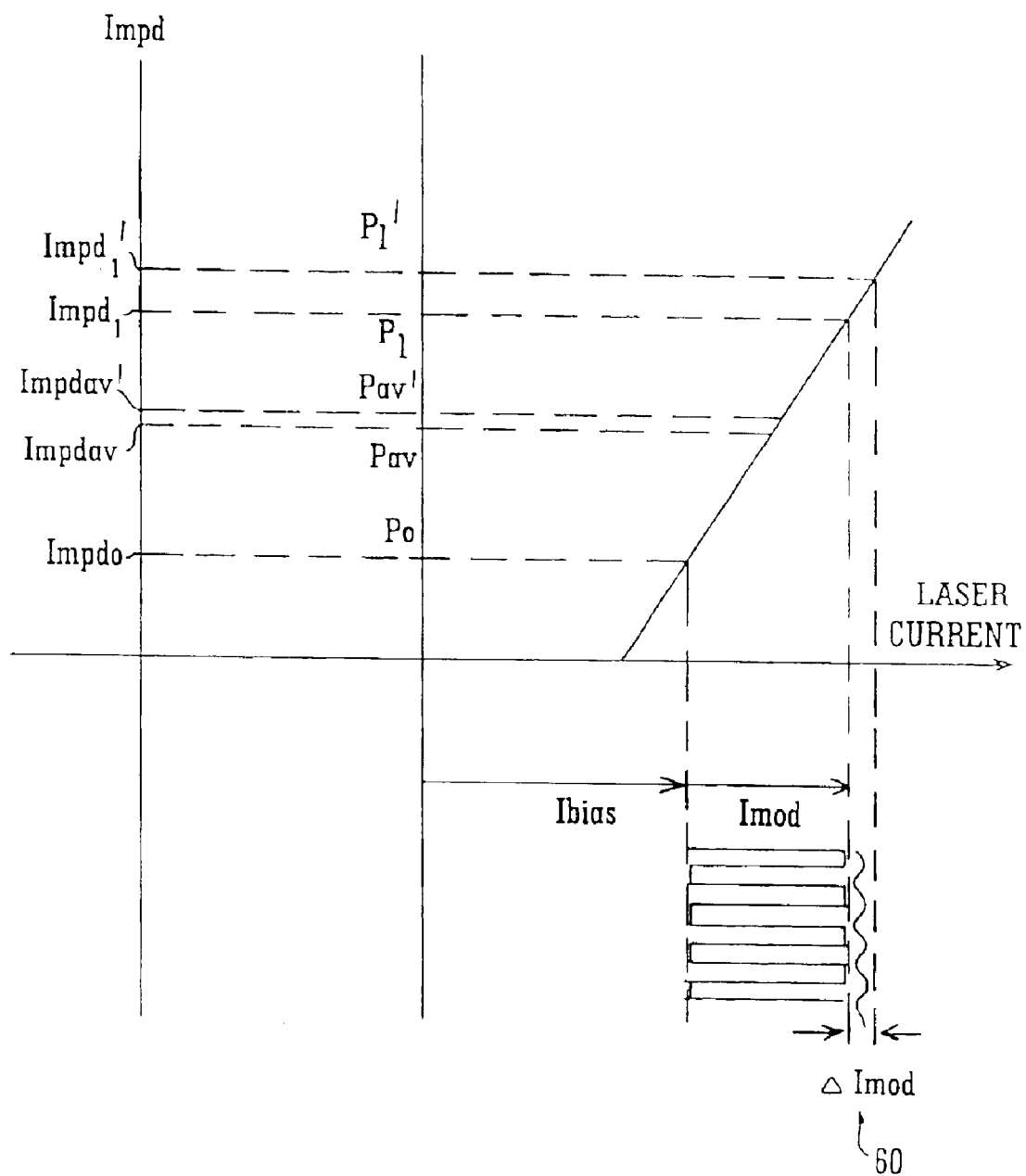
FIG. 5 shows a power/current characteristic curve of a prior art technique.

Referring to the drawings, and in particular to FIGS. 7.1 to 10, the present invention provides for a measurement of the OMA in the operating region of the power/current characteristic curve by effecting a measurement of the OMA at two positions on the curve and combining these two OMA measurements so as to effect an overall measurement value for the OMA that is adapted to take into account any variations in the slope arising from non-linearities in the operating region.

With reference to FIG. 7.1, we can define LI (LI being the average slope of the non linear laser characteristic curve in the operating region), as LI=$(P_1-P_0)$/Imod. It is possible to make a measurement of OMA by applying a test signals to the bias current Ibias and modulation current Imod so as to modulate the $P_1$ level with a waveform such as that shown in FIG. 7.1. This results in another optical level $P_1'$ being created, where $P_1'-P_1=\Delta Imod*LI''$, where LI'' is the slope of the laser characteristic curve measured in the region of $P_1$. As the optical output shifts from $P_1$ to $P_1'$, the average optical power output shifts from Pav to Pav' where Pav'−Pav=$(P_1'-P_1)$/2. A monitor photo diode MPD optically coupled to the laser diode outputs a current Impd_av corresponding to Pav and a current Impd_av' corresponding to Pav'. The relationship between the laser output power and the MPD current can be represented by a proportional constant K1 and allows for a rearrangement of the latter equation such that Impd_av'−Impd_av=$\Delta Imod*LI''*K1/2$. We set $\Delta Imod=Imod/K2$ (where K2 is another proportional constant), and by rearranging the equations can show that:

$$P1-P0=(Impd\_av'-Impd\_av)*(2*K2/K1)*(LI/LI'').$$

By defining a measurement of OMA as being:

$$OMA'=(Impd\_av'-Impd\_av)*(2*K2/K1)$$

then we can see that our measure of OMA is in error from the actual OMA by the factor LI''/LI. In this example where LI'' is less that LI, it will be understood that a measurement of OMA based on the measurement of P1 would underestimate OMA.

By applying test signals to Ibias and Imod so as to modulate the P0 level as shown in FIG. 7.2, we can show by similar analysis that our measure of OMA will be in error from the actual OMA by the factor LI'/LI, where LI' is the slope of the laser characteristic in the region of P0. In this case where LI' is greater than LI, we would over estimate LI.

This analysis has shown that the measurement of OMA is related to the slope of the laser characteristic curve in the region where the test signal is applied. The method and circuit of the present invention allow for two measurements of OMA to be taken, a first measurement that will over estimate OMA and a second that will underestimate OMA. By taking a weighted average of these two measurements, it is possible to obtain an OMA measurement that is closer to the actual OMA.

FIG. 7.3 illustrates an example of waveforms that may be applied so as to effect the dual measurement. In this case, a test signal $\Delta Ibias$ is applied to Ibias. This causes both the P0 level and the P1 level to be modulated. In this case, Pav'−Pav=(P0'−P0)/2+(P1'−P1)/2. (P0'−P0)=$\Delta Ibias*LI'$ and (P1'−P1)=$\Delta Ibias*LI''$. As was detailed above, the measurement of OMA, Impd_av'−Impd_av corresponds to Pav'−Pav. In this case, the measurement of OMA is related to the slope of the laser characteristic at two points, one in the region of P0 and the other in the region of P1. The result of this is equivalent to taking two separate OMA measurements and averaging the results to obtain a final measurement of OMA. It will be understood that the final OMA measurement will be more accurate as it is the average of an over estimate and an under estimate of OMA.

As was seen in the example of FIG. 7.1, if the OMA measurement is effected at location of slope 1, the value estimate is too large as compared to the remaining portion of the operating region whereas, as shown in FIG. 7.2 if the OMA measurement was taken at slope 2 the value would be too small. The combination of these two OMA values, as shown in FIG. 7.3 effects a more accurate estimation of the actual OMA over the entire range of the operating region.

As seen from the examples of FIGS. 7.1 to 7.3, the present invention provides for this measurement of the slope of the curve by incorporating a test signal $\Delta I_{bias}$ to the bias current. As will be appreciated from the section "background to the invention" it is the value of the bias and modulation currents that determine the positions of $P_0$ and $P_1$, which are measured within the transmission circuitry by the monitor photodiode (MPD) as $Impd_0$ and $Impd_1$ respectively. The addition of this test signal shifts the modulation current $I_{mod}$ which sits on top of the bias current rightwardly, and therefore effects the formation of two new detectable values $Impd_0'$ and $Impd_1'$ which can then be used in combination with the earlier detected values to estimate a value of the OMA at and about the two positions $P_0$ and $P_1$. These two values for the OMA as measured at specific positions in the operating region of the power/current characteristic curve can then be combined to effect a more accurate estimate of the overall OMA for the operating region of the power/current characteristic curve than is obtainable using a measurement taken at a single position and as was achievable using prior art techniques.

It will be appreciated by those skilled in the art that by utilising control circuitry or software implemented on such circuitry that the two OMA values estimated using the method of the present invention may be combined in varying weighted combinations. Three exemplary situations are shown in FIG. 8 where in: situation A, the overall OMA value is estimated from a combination of 100% of the OMA as measured on or about $P_1$ and 0% of the OMA as measured at $P_0$ (such as that shown in FIG. 7.1); situation B comprising 50% of the OMA at $P_1$ and 50% of the OMA at $P_0$ (as shown in FIG. 7.3); and situation C where the overall OMA value for the power/current characteristic curve is effectively 100% of the OMA as measured at $P_0$ and 0% of the OMA as measured at $P_1$ (as shown in FIG. 7.2). It will also be understood that the weighting given to each of the actual OMA measurements may be varied depending on the actual application or technique utilised.

Figure 9:
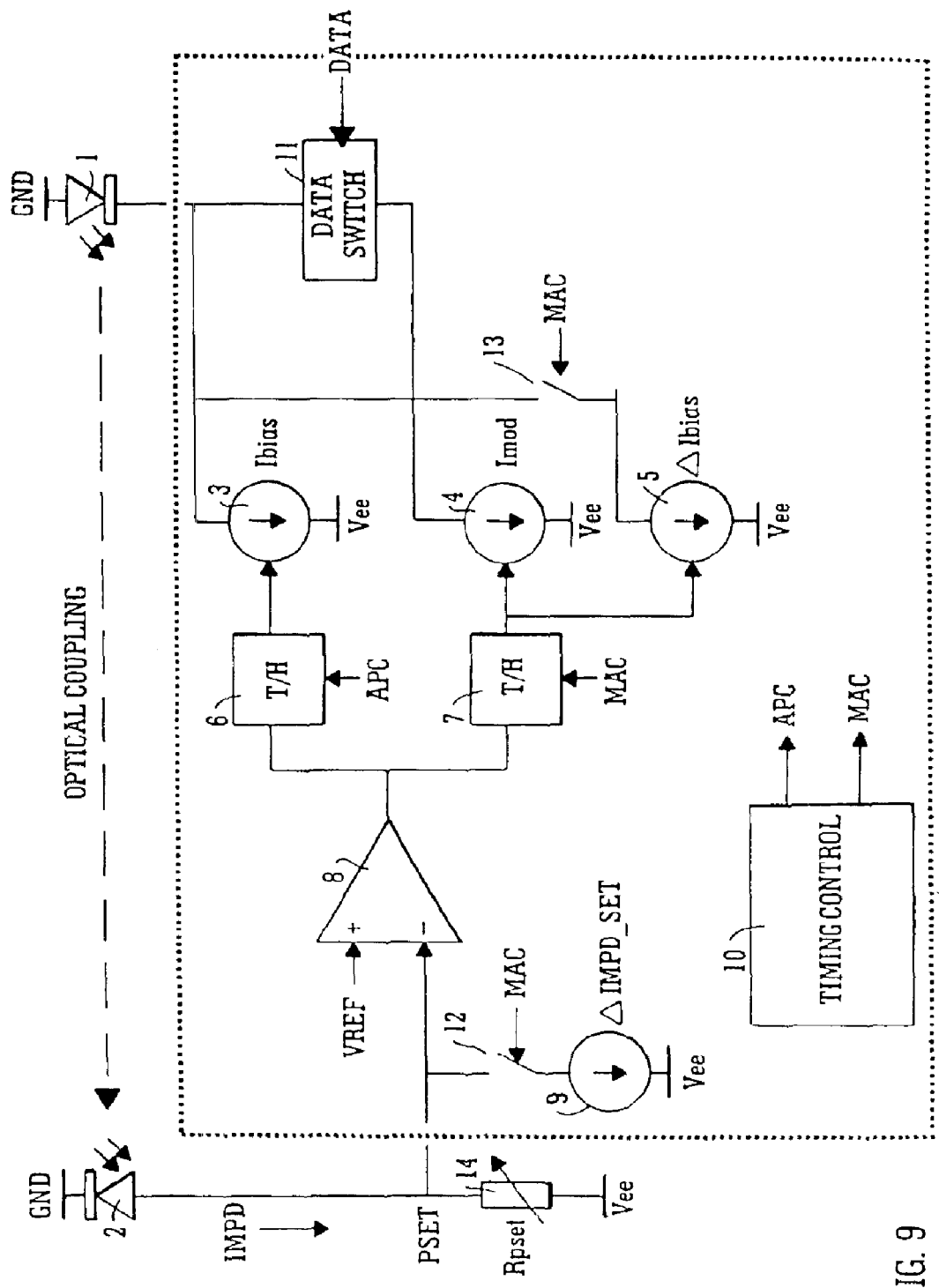
FIG. 9 shows a driver circuit in accordance with the present invention.

The OMA value is used to estimate and determine the correct modulation current. Once the OMA value has been measured it may be used to control the modulation current $I_m$ to an optical transmission laser diode 1 for operating the laser diode 1 at and at a desired OMA. As shown in FIG. 9, which is exemplary of the type of circuitry which may be used to implement the method of the present invention, a laser 1 is optically coupled to a Monitor Photo Diode (MPD) 2 which outputs a current, Impd, proportional to the average optical power of the laser. The circuit incorporates a first voltage controlled current source 3 that generates Ibias, and second voltage controlled current source that generates Imod. Additionally a third voltage controlled current source 5 is incorporated, the third source adapted to generate $\Delta$Ibias, which is desirably a fraction of Imod.

A track and hold component 6 is also utilised, and adapted such that when the average power control (APC) is high, the output voltage of track and hold component 6 follows the input voltage of track and hold component 6, and when the APC is low, the output of track and hold component 6 is held constant at the value of the input when APC transitioned from high to low.

A second track and hold module 7 is also incorporated, the second track and hold having a similar function to that of the first track and hold 6, but being adapted for use with the modulation amplitude control signal (MAC) as control signal.

The circuit additionally includes a control amplifier 8, a user adjustable current source 9, a control signal generator 10 and a data switch 11 which is adapted to switches Imod either to the laser or to ground in response to the logic '1's and '0's in the data.

An additional switch 12 is provided to connects $\Delta$IMPD_SET to PSET when MAC is high, and a switch 13 to add test signal $\Delta$Ibias to Ibias when MAC is high.

An adjustable resistor 14 is also provided.

The circuit of FIG. 9 is a dual loop control having two phases of operation. The first phase is referred to as "Average Power Control" and is active when control signal APC is high and Control signal MAC is low. The second phase is referred to as "Modulation Amplitude Control" and is active when control signal MAC is high and control signal APC is low. The timing control function 10 generates these two control signals with a typical period of 2 ms.

During the APC phase, the Imod current is held constant by track and hold component 7. Switches 13 and 14 are both open. A negative feedback control loop is formed by components 8, 6, 3, 1, 2, and 14. Under the action of this negative feedback, control amplifier 8 adjusts the value of Ibias until the two inputs of the control amplifier 8 are at the same voltage. The PSET pin will have the same voltage as VREF, a fixed reference voltage. Under this condition IMPD= VREF/Rpset. The user adjusts the value of the Rpset resistor such that VREF/Rpset is equal to the value of Impd that corresponds to the desired average power at the laser output. The APC control loop adjusts Ibias to whatever value is required to operate the laser at the desired Pav. As the laser characteristic changes due to temperature or ageing, the APC control loop adjusts Ibias as required when that loop is active.

During the MAC phase, the Ibias current is held constant by track and hold component 6. A negative feedback control loop is formed by components 8, 7, 4 & 5, 11, 12, and 14 & 9. In this phase, under the action of this negative feedback, control amplifier 8 adjusts the value of Imod until the two inputs of the control amplifier 8 are at the same voltage. Switch 13 adds a test current, $\Delta$Ibias, to Ibias. This causes the modulation signal to be shifted up the laser transfer function as was shown in FIG. 7.3. This leads to a small increase in average power $\Delta$Pav which in turn leads to a small increase in average MPD current $\Delta$Impd. This $\Delta$Impd is proportional to the average of the laser LI slopes at $P_0$ and at $P_1$. This average of two slope values is a consequence of the form of the current waveform that is applied to the laser as shown in FIG. 7.3. Switch 12 adds a current $\Delta$IMPD_ SET to the PSET input. If $\Delta$Impd is not balanced by $\Delta$IMPD_SET, the difference will flow in Rpset, leading to a change in the PSET voltage. This in turn will cause the control amplifier 8 to adjust Imod until the voltage on Pset is equal to VREF. The steady state that is reached after a number of cycles between the APC phase and the MAC phase is that the $\Delta$Impd caused by the addition of $\Delta$Ibias to Ibias is equal to $\Delta$IMPD_SET. The average slope of the laser characteristic, LI, between $P_0$ and $P_1$ is defined as LI=$(P_1-P_0)$/Imod. $\Delta$Impd=$\Delta$Ibias*LI_EST*K1 where LI_EST is the average of the laser LI slopes at $P_0$ and at $P_1$, and K1 is a constant. $\Delta$Ibias=IMOD/K2. By rearrangement of the equations, it can be shown that Imod=K2*$\Delta$Impd/ (LI_EST*K1). From the definition of LI, it can be shown that $(P_1-P_0)$=(LI/LI_EST)*(K2/K1)*$\Delta$Impd. From this, it can be seen that since LI_EST is a close approximation to LI, and K1 and K2 are constants, if $\Delta$Impd is maintained constant, then $P_1-P_0$ is maintained constant.

As the steady state condition for the MAC loop is to maintain $\Delta$Impd=$\Delta$IMPD_SET, it will be appreciated that this loop maintains the Optical Modulation Amplitude constant.

In use, the user adjusts $\Delta$IMPD_SET so that the loop settles at the desired OMA. As the laser characteristic changes due to temperature or ageing, the MAC loop adjusts Imod as required.

Figure 10:
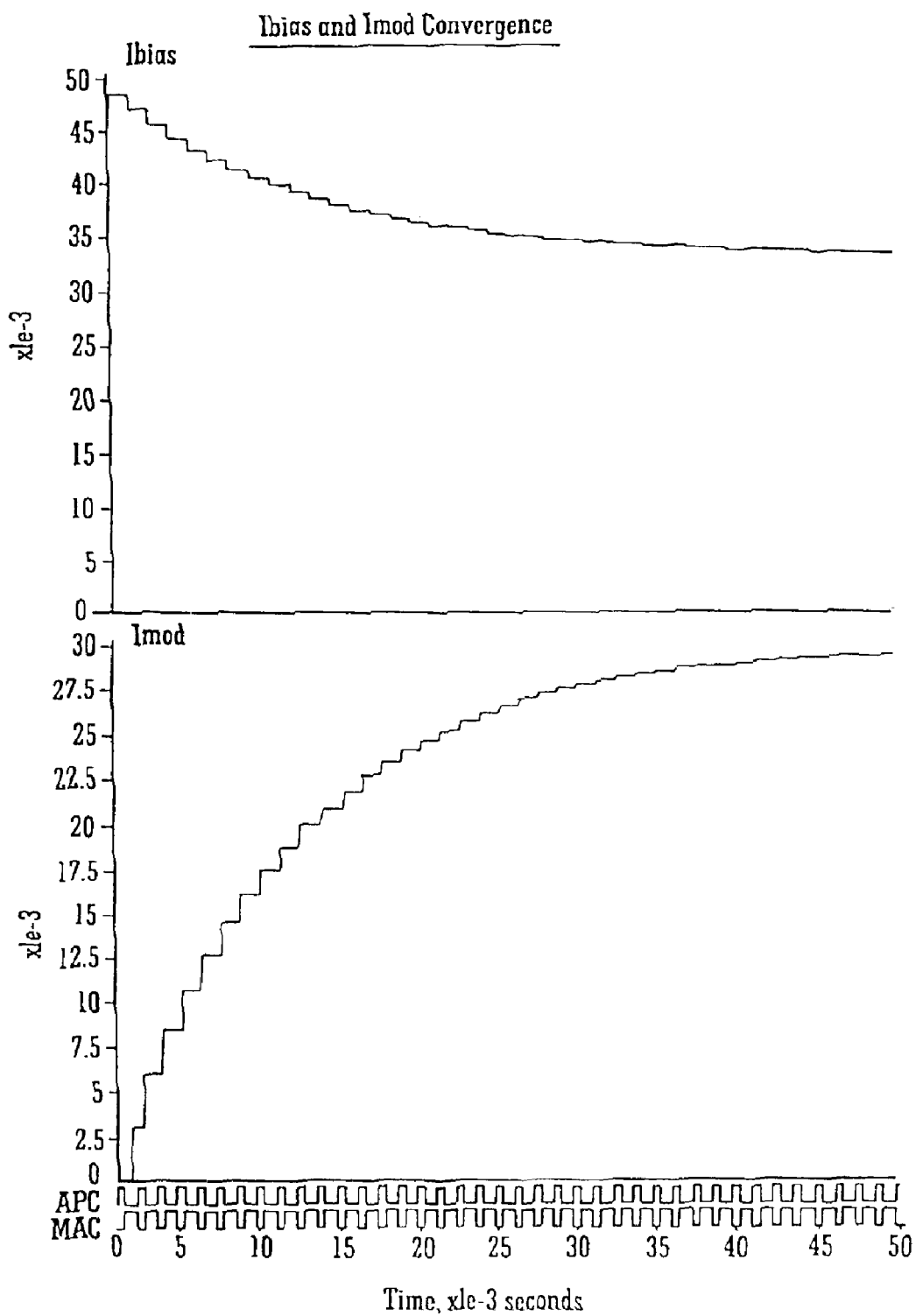
FIG. 10 shows the achievement of a steady state solution as the driver circuit settles in accordance with the present invention.

FIG. 10 shows the steady state solution being reached as the controller 10 cycles between the two loops.

It will be appreciated that the circuit and method of the present invention hereinto described is adapted for correcting the average power output $P_{av}$ and the OMA by altering the bias current $I_{bias}$ and the modulation current $I_{mod}$. Many techniques will be apparent to those skilled to those in the art If one assumes a linear response within the operating region of the power/current characteristic curve, then it can be shown that the value of $\Delta P_{av}$ obtained from utilising two measurements, as provided for by the present invention, is equivalent to that obtained using prior art methods which only use one measurement. However, if one examines the application of this technique to a curve which is not linear, such as that shown in FIGS. 7.1 to 7.3, then the benefit of this technique is evident.

It will be further appreciated by those skilled in the art that the present invention does not require the utilisation of a step current addition as the test value added to $I_{bias}$. It will be appreciated that the addition of a tonal continuous sample to $I_{bias}$ could be used as effectively as the alternate addition of a test sample.

There has been disclosed herein an improved method and architecture for measuring the OMA in the operating region of the power/current characteristic curve of a laser diode. It will be apparent to those skilled in the art that modifications may be made without departing from the spirit and scope of the invention. Accordingly, it is not intended to limit the present invention except as may be necessary in view of the appended claims.

What is claimed is:

1. A method of controlling the optical modulation amplitude (OMA) of a laser diode, the method comprising the steps of:
   a) measuring the OMA of the laser diode, the measuring of the OMA comprising the steps of:
      i) applying a test signal to a bias current signal applied to the laser diode, the application of the test signal enabling two measurements of OMA to be effected, each OMA measurement being related to the slope of the laser diode operating region as measured at a position unique to that measurement, such that measurements are made at two positions, and
      ii) combining the two OMA measurement values so as to provide a measure of the overall laser diode OMA in the operating region,
   b) comparing the measured value of the OMA with a predetermined corresponding reference OMA value, and
   c) altering the modulation current to the laser diode in response to the measured OMA value not comparing favourably with the reference OMA value.

2. The method as claimed in claim 1 wherein the two OMA measurements are related to the slope of the laser diode operating region as measured about $P_0$ and $P_1$.

3. The method as claimed in claim 2 wherein the combined two measurements of OMA are effected by detecting the change in average power resultant from the application of the test signal.

4. The method as claimed in claim 1 wherein the test signal is a signal applied to the bias current at predetermined time sequences during the operation of the laser diode.

5. The method as claimed in claim 1 wherein the test signal is a continual signal applied throughout operation of the laser diode.

6. The method as claimed in claim 1 comprising the additional step of applying a modulation test signal to a modulation current applied to the laser diode.

7. The method as claimed in claim 6 wherein the application of two test signals, one to the bias current and one to the modulation current provides for a weighting value to be applied to the combination of the two measurement values.

8. The method as claimed in claim 7 wherein the modulation test signal is incorporated with or applied to the modulation current at the same time as the test signal is applied to the bias current.

9. The method as claimed in claim 8 wherein the weighting value applied to the combination of the two measurement values may be varied by changing the size of test signal applied to the bias current as compared to the size of the modulation test signal applied to the modulation current.

10. The method as claimed in claim 9 wherein the weighted combination of the two measurement values is provided by the output of a monitor photo diode coupled to the laser diode.

11. The method as claimed in claim 6 comprising the steps of applying a first modulation test signal to the modulation current at the same time as a first test signal is applied to the bias current thereby forming a first OMA measurement value and some time later providing for a second modulation test signal to be applied to the modulation current at the same time as a second test signal is applied to the bias current thereby forming a second OMA measurement value, the combination of the first and second OMA measurement values effecting an overall OMA measurement for the laser diode operating region.

12. The method as claimed in claim 11 wherein the combination of the first and second OMA measurements is conducted in a weighted manner.

13. The method as claimed in claim 12 wherein the first set of test signals provides for a measurement of OMA related to the slope as measured about $P_1$ as opposed to the slope as measured about $P_0$.

14. The method as claimed in claim 13 wherein the measurement of the slope about $P_1$ as opposed to the slope as measured about $P_0$ is effected by a minimal test signal being incorporated with the bias current and a modulation test signal being incorporated with the modulation current.

15. The method as claimed in claim 12 wherein the second set of test signals provides for a measurement of OMA related to the slope as measured about $P_0$ as opposed to the slope as measured about $P_1$.

16. The method as claimed in claim 15 wherein the measurement of the slope as measured about $P_0$ as opposed to the slope as measured about $P_1$ is effected by a test signal being incorporated with the bias current and a complementary modulation test signal being incorporated with the modulation current.

17. The method as claimed in claim 13 or 15 wherein the weighting of the combination of the first and second OMA measurements so as to provide an overall OMA measurement is effected by combining the first and second OMA measurements in a suitable manner.

18. The method as claimed in claim 17 further comprising the steps of storing the output of the monitor photo diode for each cycle and processing of successive stored outputs so as to effect a weighted average.

19. The method as claimed in claim 1 wherein the OMA measurement is detected using a monitor photo diode, a change in average power as detected by the MPD giving a value indicative of the OMA.

20. The method as claimed in claim 1 or claim 6 wherein the amplitudes or size of the test signal is related to the amplitude or size of the modulation current.

21. The method as claimed in claim 20 wherein the amplitude of the test signal is of magnitude sufficiently small as not to affect normal operation of the laser diode.

22. The method as claimed in claim 21 wherein the size of the test signal by which the bias current or modulation current is altered does not exceed 5% of the value of the modulation current.

23. The method as claimed in claim 22 wherein the test signal amplitude does not exceed 1% of the value of the modulation current.

24. The method as claimed in claim 1 or claim 6 wherein the test signal applied is selected from a number of different types of signal types including a pseudo digital waveform, square waves, or sinusoidal type waveforms.

25. The method as claimed in claim 1 wherein the modulation current is altered by a predetermined value.

26. The method as claimed in claim 1 wherein the modulation current is altered by an amount proportional to the difference in value between the measured OMA value and the reference OMA value.

27. The method as claimed in claim 1 wherein the OMA value in the operating region of the power/current characteristic curve of the laser diode is compared with the reference OMA value at periodic intervals.

28. The method as claimed in claim 27 wherein the periodic intervals are about 5 ms.

29. The method as claimed in claim 1 wherein the reference OMA value is set and stored during calibration of the laser diode.

30. The method as claimed in claim 1 wherein the reference OMA value is a reference value of the change in the average power output of the laser diode which should result from the alteration to the bias current by the test signal if the laser diode were operating at the desired OMA.

31. A method for controlling the extinction ratio of a laser diode, the method comprising the steps of:
   a) controlling the average power of the laser diode, and
   b) controlling the optical modulation amplitude, the method of controlling the optical modulation amplitude comprising the steps of:
      i) measuring the OMA of the laser diode, the measuring of the OMA comprising the steps of:
         a) applying a test signal to a bias current signal applied to the laser diode, the application of the test signal enabling two measurements of OMA to be effected, each OMA measurement being related to the slope of the laser diode operating region as measured at a position unique to that measurement, such that measurements are made at two position, and
         b) combining the two OMA measurement values so as to provide a measure of the overall laser diode OMA within the operating region,
      ii) comparing the measured value of the OMA with a predetermined corresponding reference OMA value, and
      iii) altering the modulation current to the laser diode in response to the measured OMA value not comparing favourably with the reference OMA value.

32. The method as claimed in claim 31 wherein the step of controlling the average power comprises the steps of:
   a) measuring the average power,
   b) comparing the measured average power value with a reference average power value and
   c) altering the bias current to the laser diode in response to the measured average power not comparing favourably with the reference average power.

33. The method as claimed in claim 32 wherein the bias current is altered by a predetermined value.

34. The method as claimed in claim 32 wherein the bias current is altered by an amount proportional to the difference in value between the measured average power and the reference average power.

35. The method as claimed in claim 31 wherein the comparison of the OMA value with the reference OMA value and the comparison of the average power output with the reference average power output value are alternately made.

36. The method as claimed in claim 35 wherein the portion of the bias current not including the test signal is maintained constant during the period while the OMA value of the power/current characteristic curve is being determined.

37. The method as claimed in claim 35 wherein the portion of the modulation current not including the test signal is maintained constant during the period while the average power value of the power/current characteristic curve is being determined.

38. The method as claimed in claim 31 wherein the comparison is made concurrently so as to allowing for the bias current and the modulation currents to be corrected at the same time.

39. A control circuit adapted to measure the optical modulation amplitude (OMA) in the operating region of a laser diode, the circuit comprising:
   a) means for incorporating a test signal with a bias current signal applied to the laser diode,
   b) means for enabling two measurements of OMA to be effected, each OMA measurement being related to the slope of the laser diode operating region as measured at a position unique to that measurement, such that measurement are made at two position, and
   c) means for combining the two OMA measurement values so as to provide a measure of the overall laser diode OMA within the operating region.

40. A control circuit for controlling the OMA of a laser diode, the control circuit comprising:
   a) means for determining a value for the OMA in the operating region of the power/current characteristic curve of the laser diode, the value determined being related to the value of the OMA as measured at two positions in the operating region,
   b) comparing means for comparing the measured OMA value with a corresponding reference OMA value,
   c) a first control means for controlling the modulation current to the laser diode, the first control means being responsive to the comparing means for altering the modulation current in response to the measured OMA value not comparing favourably with the reference OMA value.

41. The circuit as claimed in claim 40 wherein the means for determining the OMA value in the operating region of the power/current characteristic curve of the laser diode comprises:
   a) a second control means for altering the bias current to the laser diode by a test amount, and
   b) a means for determining the corresponding change in the average power output of the laser diode resulting from the alteration of the bias current by the test amount.

42. The circuit as claimed in claim 40 wherein the comparing means compares the change in the average power output of the laser diode with a reference value.

43. The circuit as claimed in claim 41 wherein the second control means maintains the alteration to the bias current by the test amount for a period sufficient to allow the resulting corresponding change in the average power output of the laser diode to be determined.

44. The circuit as claimed in claim 43 wherein the test amount by which the bias current is altered by the second control means is such as not to affect the normal operation of the laser diode.

45. The circuit as claimed in claim 43 wherein the test amount by which the bias current is altered by the second control means is proportional to the modulation current when the bias current is being altered.

46. The circuit as claimed in claim 41 wherein the second control means increases the bias current by the test amount, the test amount by which the bias current is altered by the second control means not exceeding 5% of the modulation current when the bias current is being altered.

47. The circuit as claimed in claim 40 wherein the first control means alters the modulation current by a correcting amount in response to the measured OMA value not comparing favourably with the reference OMA value, the correcting amount not exceeding 1% of the maximum value of the modulation current which may be applied by the first control means.

48. The circuit as claimed in claim 40 wherein the first control means alters the modulation current by a correcting amount in response to the measured OMA value not comparing favourably with the reference OMA value, the correcting amount being proportional to the difference between the measured OMA value and the reference OMA value.

49. The circuit as claimed in claim 40 wherein the first control means alters the modulation current by a correcting amount in response to the measured OMA value not comparing favourably with the reference OMA value, the correcting amount being a predetermined amount.

50. The circuit as claimed in claim 40 further comprising a power output comparing means for comparing the average power output of the laser diode with a predetermined reference average power output value, and a bias current control means for controlling the bias current to the laser diode, the bias current control means being responsive to the power output comparing means for altering the bias current to the laser diode in response to the average power output of the laser diode not comparing favourably with the reference average power output value.

51. The circuit as claimed in claim 50 wherein the comparing means and the power output comparing means are alternately operated for alternately comparing the OMA value with the reference OMA value and the average power output with the reference average power output value, respectively.

52. The circuit as claimed in claim 50 wherein the bias current control means holds the portion of the bias current not including the test signal constant while the second control means is altering the bias current by the test amount.

53. The circuit as claimed in claim 50 wherein the modulation current control means holds the portion of the modulation current not including the test signal constant while the measured average power is being compared to the reference average power.

54. The circuit as claimed in claim 50 further comprising means for setting the reference OMA value.

55. The circuit as claimed in claim 50 wherein the OMA comparing means and the power output comparing means are concurrently operated for concurrently comparing the measured OMA value with the reference OMA value and the average power output with the reference average power output value, respectively.

56. A laser diode driver circuit comprising:
   a) a modulation current source for providing a current for modulation in response to a data stream to be transmitted by the laser diode,
   b) a bias current source for providing a bias current to the laser diode,
   c) a control circuit for controlling the OMA of the laser diode, the control circuit comprising:
      i) a means for determining a value for the OMA in the operating region of the power/current characteristic curve of the laser diode, the measured OMA value being related to the slope as measured at two positions of the operating portion of the power/current characteristic curve,
      ii) an OMA comparing means for comparing the measured OMA value related to the slope of the power/current characteristic curve with a corresponding reference OMA value,
      iii) a first control means for controlling the modulation current source, the first control means being responsive to the OMA comparing means for altering the modulation current from the modulation current source in response to the measured OMA value not comparing favourably with the reference OMA value, and
      iv) a second control means for altering the bias current by a test amount and determining the corresponding change in the average power output resultant from said alteration.

57. A laser diode driver circuit for driving a laser diode having a monitor photo diode optically coupled thereto, the monitor photo diode (MPD) having an output current indicative of the OMA value of the laser diode, the circuit comprising:
   a) a modulation current source for providing a current for modulation in response to a data stream to be transmitted by the laser diode,
   b) a control circuit for controlling the OMA of the laser diode, the control circuit comprising:
      i) comparing means adapted to compare an output MPD current with a reference current,
      ii) a first control means for controlling the modulation current source, the first control means being responsive to the OMA comparing means for altering the modulation current from the modulation current source in response to the measured OMA value not comparing favourably with the reference OMA value, and wherein
   c) the output current of the MPD is a value indicative of a combination of the OMA value as measured at two positions of the operating portion of the power/current characteristic curve.

58. The circuit as claimed in claim 57 additionally comprising:
   a) a bias current source for providing a bias current to the laser diode,
   b) a second control means for altering the bias current by a test amount and determining the corresponding change in the average power output resultant from said alteration, and wherein the average power is detected from the output of the MPD.

* * * * *